(12) United States Patent
Crocker, Jr. et al.

(10) Patent No.: US 7,005,378 B2
(45) Date of Patent: Feb. 28, 2006

(54) PROCESSES FOR FABRICATING CONDUCTIVE PATTERNS USING NANOLITHOGRAPHY AS A PATTERNING TOOL

(75) Inventors: Percy Vandorn Crocker, Jr., Chicago, IL (US); Linette Demers, Evanston, IL (US); Nabil A. Amro, Skokie, IL (US)

(73) Assignee: Nanoink, Inc., Chicago, IL (US)

( * ) Notice: Subject to any disclaimer, the term of this patent is extended or adjusted under 35 U.S.C. 154(b) by 0 days.

(21) Appl. No.: 10/647,430

(22) Filed: Aug. 26, 2003

(65) Prior Publication Data

US 2004/0127025 A1 Jul. 1, 2004

Related U.S. Application Data

(60) Provisional application No. 60/419,781, filed on Oct. 21, 2002, and provisional application No. 60/405,741, filed on Aug. 26, 2002.

(51) Int. Cl.
*H01L 21/44* (2006.01)

(52) U.S. Cl. ............ 438/674; 438/646; 438/626; 438/647; 438/929; 438/644; 438/675

(58) Field of Classification Search .......... 438/1, 438/962, 49, 677, 393, 394, 395, 676, 678
See application file for complete search history.

(56) References Cited

U.S. PATENT DOCUMENTS

| | | | | |
|---|---|---|---|---|
| 6,146,716 | A | * | 11/2000 | Narang ............ 427/559 |
| 6,271,130 | B1 | * | 8/2001 | Rajh et al. ........ 438/677 |
| 6,325,904 | B1 | * | 12/2001 | Peeters ............ 257/414 |
| 6,635,311 | B1 | * | 10/2003 | Mirkin et al. ..... 427/256 |
| 6,737,646 | B1 | * | 5/2004 | Schwartz .......... 250/306 |
| 2004/0131843 | A1 | * | 7/2004 | Mirkin et al. ..... 428/327 |

* cited by examiner

*Primary Examiner*—B. William Baumeister
*Assistant Examiner*—Igwe U. Anya
(74) *Attorney, Agent, or Firm*—Foley & Lardner LLP

(57) ABSTRACT

Nanolithographic deposition of metallic nanostructures using coated tips for use in microelectronics, catalysis, and diagnostics. AFM tips can be coated with metallic precursors and the precursors patterned on substrates. The patterned precursors can be converted to the metallic state with application of heat. High resolution and excellent alignment can be achieved.

54 Claims, 5 Drawing Sheets

Platinum nanostructures deposited via the DPN process onto Silicon oxide surface.

(a) Pd(acac) patterns on Si/SiOx (b) Pd metal patterns on Si/SiOx (c) Line scan indicating average height of metal lines Platinum nanostructures deposited via the DPN process onto Silicon oxide surface.

0.5 gm of Palladium(II) acetate (Aldrich) was added to a 10 ml methanol, then 0.4 gm of acetic acid (EM science) was added to the mixture in small portion. The content were allowed to stir for 5 h at room temperature under Ar.

The lateral force image before heating was imaged using the Palladium coated tip After heating at 100°C, the image was taken using a clean tip.

PROCESSES FOR FABRICATING CONDUCTIVE PATTERNS USING NANOLITHOGRAPHY AS A PATTERNING TOOL

RELATED APPLICATIONS

This application claims benefit to provisional application Ser. No. 60/405,741 to Crocker et al. filed Aug. 26, 2002, and Ser. No. 60/419,781 to Crocker et al. filed Oct. 21, 2002 and incorporated herein by reference in its entirety.

BACKGROUND

Many important applications in biotechnology, diagnostics, microelectronics, and nanotechnology require nanostructures of metals, one of the fundamental types of matter. For example, better microelectronics are needed to provide for smaller and faster computer chips and circuit boards, and metals can provide the required electrical conductivity to complete a circuit. Metals also can be used as catalysts. The processing of metals, however, can be difficult, and operating at the nanoscale can make matters even more difficult. Many methods are limited to micron level manufacturing. Many methods are limited by the need for electrochemical biases or very high temperatures. Moreover, many methods are limited by physical requirements of the deposition process such as ink viscosity. Better methods are needed to fabricate metallic nanostructures by means which provide for, among other things, alignment, ability to layer films and wires, high resolution, and versatility.

SUMMARY

The present invention comprises a series of embodiments which are summarized herein without limiting the scope of the invention. For example, the present invention provides a method of depositing a conductive coating in a desired pattern onto a substrate comprising:

(a) depositing a precursor onto the substrate in the desired pattern by nanolithography with use of a tip coated with the precursor, (b) contacting the precursor with a ligand, (c) applying sufficient energy, optionally from an extended radiation source, to transfer electrons from the ligand to the precursor, thereby decomposing the precursor to form a conductive precipitate in the desired pattern and thus forming the conductive pattern directly on the substrate.

The present invention also provides a method of printing a conductive metal in a desired pattern onto a substrate comprising:

(a) drawing a metal precursor and ligand directly onto the substrate according to the desired pattern using nanolithography with use of a tip coated with a precursor; and (b) decomposing the precursor by applying energy, optionally from an extended radiation source, to form the conductive metal in the desired pattern, without removing from the substrate a substantial quantity of the precursor, and without removing from the substrate a substantial quantity of the metal.

The present invention also provides a nanolithographic method comprising depositing a metallic precursor from a tip onto a substrate to form a nanostructure and subsequently converting the precursor nanostructure to a metallic deposit. The deposition can be carried out without use of an electrical bias between the tip and substrate.

The present invention also provides a nanolithographic method consisting essentially of: depositing an ink composition consisting essentially of a metallic precursor from a nanoscopic tip onto a substrate to form a nanostructure, and subsequently converting the metallic precursor of the nanostructure to a metallic form. Basic and novel aspects of the invention are noted throughout this specification, but these aspects include that stamps and resists are not needed, electrochemical bias is not needed, expensive equipment not readily available for typical research laboratories and production facilities is not needed, and reaction between the substrate and the ink is not needed. Accordingly, compositions and inks can be formulated and patterned without these limitations.

The present invention also provides a method of printing without use of electrochemical bias or reaction between the ink and substrate comprising depositing a metallic precursor ink composition onto a substrate from a tip in the form of a microstructure or nanostructure on the substrate to form an array having discreet objects separated from each other by about one micron or less, about 500 nm or less, or about 100 nm or less.

The present invention also provides patterned arrays comprising a substrate and discreet nanoscopic and/or microscopic metal deposits thereon prepared by the methods according to this invention. The metal deposits can be, for example, rectangles, squares, dots, or lines.

The present invention also provides methods of using these methods including, for example, preparing sensors, biosensors, and lithographic templates, as well as other applications described herein.

DETAILED DESCRIPTION

Figure 1:
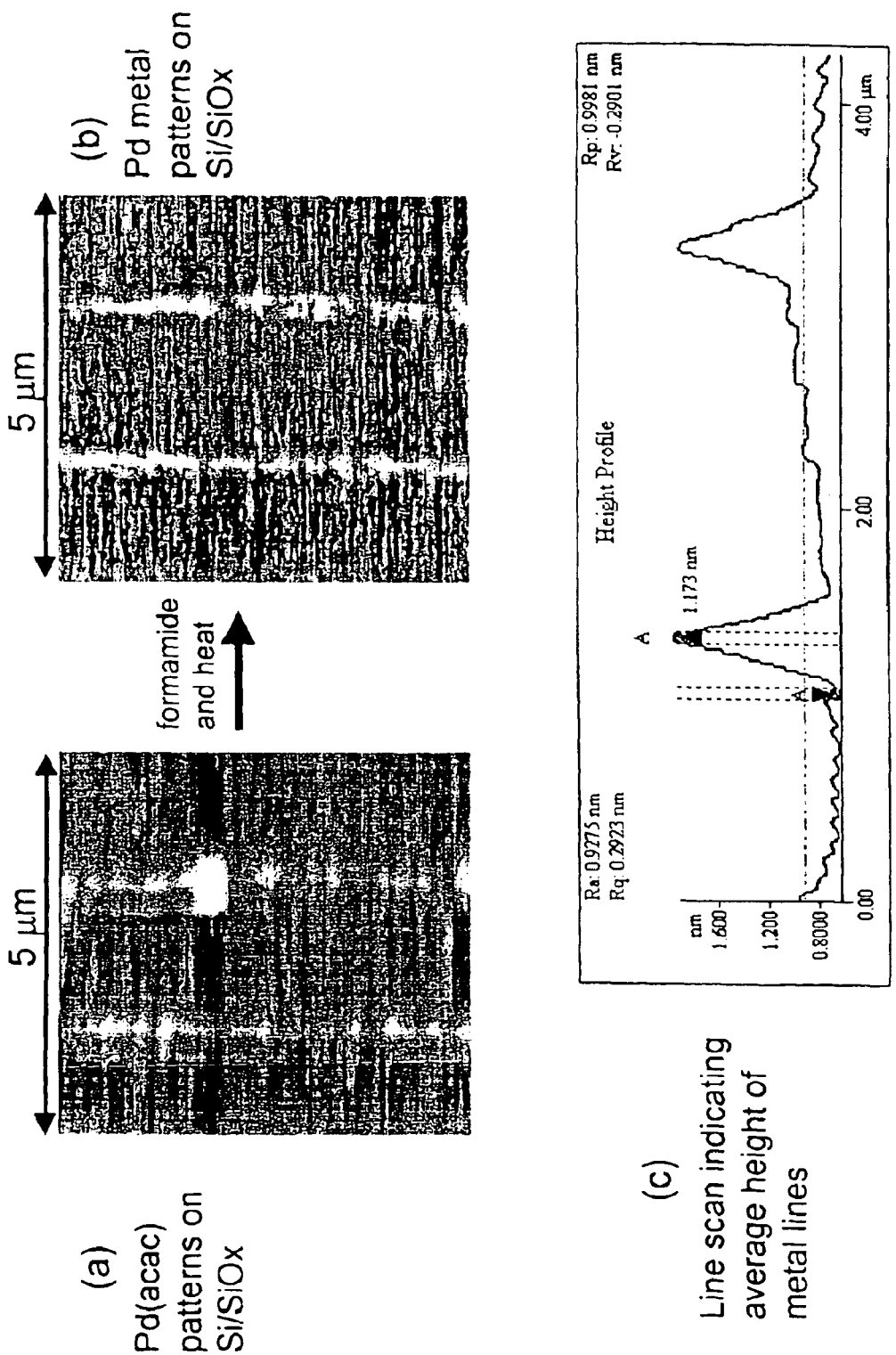
FIG. 1 illustrates AFM data of palladium structures according to the present invention in Working Example 1.

This application claims benefit to provisional application Ser. No. 60/405,741 to Crocker et al. filed Aug. 26, 2002, and Ser. No. 60/419,781 to Crocker et al. filed Oct. 21, 2002 and incorporated herein by reference in its entirety.

DPN™ and DIP PEN NANOLITHOGRAPHY™ are trademarks of Nanolnk, Inc. and are used accordingly herein (e.g, DPN printing or DIP PEN NANOLITHOGRAPHY printing). DPN methods and equipment are generally available from Nanolnk, Inc. (Chicago, Ill.), including the NScriptor™ which can be used to carry out the nanolithography according to the present invention.

Although this specification provides guidance to one skilled in the art to practice the invention including reference to the technical literature, this reference does not constitute an admission that the technical literature is prior art.

Direct-write technologies can be carried out by methods described in, for example, *Direct-Write Technologies for Rapid Prototyping Applications: Sensors, Electronics, and Integrated Power Sources*, Ed. by A. Pique and D. B.

Chrisey, Academic Press, 2002. Chapter 10 by Mirkin, Demers, and Hong, for example, describes nanolithographic printing at the sub-100 nanometer length scale, and is hereby incorporated by reference (pages 303–312). Pages 311–312 provide additional references on scanning probe lithography and direct-write methods using patterning compounds delivered to substrates from nanoscopic tips which can guide one skilled in the art in the practice of the present invention. This text also describes electrically conductive patterns.

Nanolithography and nanofabrication is also described in Marc J. Madou's *Fundamentals of Microfabrication, The Science of Miniaturization*, $2^{nd}$ Ed., including metal deposition at pages 344–357.

Multiple embodiments are disclosed in this application for fabricating conductive patterns with use of dip pen nanolithography (DPN) printing as a patterning tool. For all embodiments in this disclosure, the following documents which disclose DPN printing methods are hereby incorporated by reference and form part of the present disclosure:
(1) Piner et al. *Science*, 29 Jan. 1999, Vol. 283 pgs. 661–663.
(2) U.S. Provisional application No. 60/115,133 filed Jan. 7, 1999 to Mirkin et al.
(3) U.S. Provisional application No. 60/207,713 filed Oct. 4, 1999 to Mirkin et al.
(4) U.S. Regular patent application Ser. No. 09/477,997 filed Jan. 5, 2000 to Mirkin et al.
(5) U.S. Provisional application No. 60/207,713 filed May 26, 2000 to Mirkin et al.
(6) U.S. Provisional application No. 60/207,711 filed May 26, 2000 to Mirkin et al.
(7) U.S. Regular application Ser. No. 09/866,533 filed May 24, 2001 to Mirkin et al.
(8) U.S. patent publication number 2002/0063212 A1 published May 30, 2002 to Mirkin et al.
(9) PCT publication number WO 00/41213 A1 published Jul. 13, 2000 based on PCT application no. PCT/US00/00319 filed Jan. 7, 2000 to Mirkin et al.
(10) PCT publication WO 01/91855 A1 published Dec. 6, 2001 based on PCT application no. PCT/US01/17067 filed May 25, 2001 to Mirkin et al.
(11) U.S. Provisional application No. 60/326,767 filed Oct. 2, 2001, "Protein Arrays with Nanoscopic Features Generated by Dip-Pen Nanolithography" (see also patent publication No. 2003/0068446 to Mirkin et al. "Protein and Peptide Nanoarrays")
(12) U.S. Provisional application No. 60/337,598 filed Nov. 30, 2001, "Patterning of Nucleic Acids by Dip-Pen Nanolithography" and regular patent application Ser. No. 10/307,515 filed Dec. 2, 2002 to Mirkin et al.;
(13) U.S. Provisional application No. 60/341,614 filed Dec. 17, 2001, "Patterning of Solid State Features by Dip-Pen Nanolithography" and regular application Ser. No. 10/320,721 filed Dec. 17, 2002 to Mirkin et al.;
(14) U.S. Provisional application No. 60/367,514 filed Mar. 27, 2002, "Method and Apparatus for Aligning Patterns on a Substrate" and U.S. regular application Ser. No. 10/366,717 to Eby et al. filed Feb. 14, 2003;
(15) U.S. Provisional application No. 60/379,755 filed May 14, 2002, "Nanolithographic Methods Calibration Methods" and U.S. regular application Ser. No. 10/375,060 to Cruchon-Dupeyrat et al. filed Feb. 28, 2003;
(16) U.S. Provisional application No. 60/379,755 filed Aug. 9, 2002, "Apparatus, Materials, and Methods for Fabrication and Catalysis"
(17) Demers et al. *Angew Chem. Int. Ed. Engl.* 2001, 40(16), 3069–3071.
(18) Demers et al. *Angew Chem. Int. Ed. Engl.* 2001, 40(16), 3071–3073.
(19) Liu et al. *Adv. Mater.* 2002, 14, No. 3, Feb. 5, 231–234.
(20) L. M. Demers et al., "Direct Patterning of Modified Oligonucleotides on Metals and Insulators by Dip-Pen Nanolithography," *Science*, 2002, June 7, 296, pages 1836–1838.

The present invention is not limited to use of only one tip to print but, rather, multiple tips can be used, see for example, U.S. Patent Publication 2003/0022470 ("Parallel, Individually Addressable Probes for Nanolithography") to Liu et al. published Jan. 30, 2003.

In particular, in prior application Ser. No. 09/866,533, filed May 24, 2001 (references 7 and 8 above, 2002/0063212 A1 published May 30, 2002), direct-write nanolithographic printing background and procedures are described in detail covering a wide variety of embodiments including, for example: background (pages 1–3); summary (pages 3–4); brief description of drawings (pages 4–10); use of scanning probe microscope tips (pages 10–12); substrates (pages 12–13); patterning compounds (pages 13–17); practicing methods including, for example, coating tips (pages 18–20); instrumentation including nanoplotters (pages 20–24); use of multiple layers and related printing and lithographic methods (pages 24–26); resolution (pages 26–27); arrays and combinatorial arrays (pages 27–30); software and calibration (pages 30–35; 68–70); kits and other articles including tips coated with hydrophobic compounds (pages 35–37); working examples (pages 38–67); corresponding claims and abstract (pages 71–82); and FIGS. 1–28. This disclosure is not and need not be repeated here but is hereby incorporated by reference in its entirety.

Also, US patent publication 2002 0122873 A1, published Sep. 5, 2002 to Mirkin et al., is not and need not be repeated here but is hereby incorporated by reference in its entirety. This published application includes, for example, use of tips which have external openings and internal cavities, and use of electrical, mechanical, and chemical driving forces for transporting the ink (or deposition compound) to the substrate. One method includes aperture pen nanolithography, wherein the rate and extent of the movement of the deposition compound through the aperture is controlled by the driving force. This published application also describes coated tips, patterns, substrates, inks, patterning compounds, deposition compounds, multiple tip nanolithography, multiple deposition compounds, and arrays.

Nanolithography is also described in the following references:
(a) B. W. Maynor et al., *Langmuir*, 17, 2575–2578 ("Au 'Ink' for AFM 'Dip-Pen' Nanolithography") describes formation of gold nanostructures by surface-induced reduction of metal ions. This method, however, involves careful selection of appropriate gold precursors and substrate surfaces which react with the gold which limits the process and is not required in the present invention.
(b) Y. Li et al., *J. Am. Chem. Soc.*, 2001, 123, 2105–2106 ("Electrochemical AFM 'Dip-Pen' Nanolithography") describes deposition of platinum metal. This method, however, involves using external electrochemical bias between the tip and substrate which limits the process and is not required in the present invention.

In the DPN printing process, an ink is transferred to a substrate. The substrate can be flat, rough, curved, or have surface features. The substrate can be previously patterned. Immobilization of the ink on the substrate can be by chemical adsorption and/or covalent bonding. The transferred ink, if desired, can be used directly as part of a fabrication design or used indirectly as a template for further fabrication. For example, a protein can be directly patterned onto a substrate by DPN printing, or a template compound can be patterned which is used to bind a protein. The advantages and applications for DPN printing are numerous and described in the above references. Complex structures with high resolution and excellent registration can be achieved, for example. Structures with line widths, cross sections, and circumferences of less than one micron, and in particular, less than 100 nm, and in particular, less than 50 nm can be achieved. In sum, DPN printing is an enabling nanofabrication/nanolithographic technology which allows one to practice fabrication and lithography at the nanometer level with exceptional control and versatility. This type of nanofabrication and nanolithography can be difficult to achieve with many technologies that are more suitable for micron scale work. DPN printing can be also used if desired to prepare micron scale structures but, in general, nanostructures are preferred.

The tip can be a nanoscopic tip. It can be a scanning probe microscopic tip including an AFM tip. It can be hollow or non-hollow. Ink can pass through the middle of a hollow tip, coating the end of the tip. The tip can be modified to facilitate printing of the precursor ink. In general, it is preferred that the tip does not react with the ink and can be used over extended periods of time.

The patterns deposited by the nanolithography are not particularly limited by the shape of the pattern. Common patterns include dots and lines and arrays thereof. The height of the pattern can be, for example, about 10 nm or less, and more particularly about 5 nm or less. If lines are patterned, the lines can be, for example, about one micron wide or less, and more particularly, about 500 nm wide or less, and more particularly about 100 nm wide or less. If dots are patterned, the dots can be, for example, about one micron wide in diameter or less, and more particularly, about 500 nm wide or less, and more particularly about 100 nm wide or less.

Although the nanolithography is preferably carried out to form nanostructures, structures at a micron scale can be also of interest. For example, experiments used to pattern a structure of 1–10 square microns in area, such as a rectangle, square, dot, or line, can be useful in also designing experiments for smaller nanostructures.

In another embodiment, conductive patterns, including nanoscopic patterns, are formed with use of DPN printing with use of the following steps:

1) depositing a precursor such as, for example, a metal salt, onto a substrate in a desired pattern with use of a coated tip, 2) applying an appropriate ligand onto the substrate, wherein for example the ligand comprises a donor atom such as nitrogen, phosphorous, or sulfur, 3) applying sufficient energy to transfer electrons from the ligand to the precursor by, for example, radiant heat, thereby decomposing the precursor to form a precipitate such as, for example, a metal.

Metal patterning processes and chemistries are disclosed in (1) U.S. Pat. No. 5,980,998 to Sharma et al. (issued Nov. 9, 1999), which is hereby incorporated by reference, and (2) U.S. Pat. No. 6,146,716 to Narang et al. (issued Nov. 14, 2000), which is hereby incorporated by reference. However, these references do not disclose or suggest the use of dip pen nanolithography printing or other nanolithographies for deposition, nor do they disclose or suggest advantages which accrue from DPN printing. Rather, they disclose use conventional printing methods with use of dispensers comprising a reservoir and an applicator. Herein, embodiments are disclosed in which the chemistry and patterning as disclosed in the Sharma U.S. Pat. No. 5,980,998 are generally modified in unexpected ways with unexpected results to include DPN printing as a patterning method, and the DPN printing process is changed in unexpected ways with unexpected results to include the chemistry as disclosed in the Sharma U.S. Pat. No. 5,980,998.

The ink solution is generally contemplated herein to include a solvent and solute. The solvent can be any material capable of solvating the solute, but is generally contemplated to comprise an inexpensive, readily available, relatively non-toxic material such as water, various alcohols and so forth. The solute is generally contemplated to include at least two components which chemically react with one another under the influence of an energy source, such that a metal or other substance precipitates out of the solution. In preferred embodiments one component of the solute comprises a salt, while another component of the solute comprises an appropriate ligand. As used herein the term "salt" means any combination of an acid (A) and a base (B). Examples are metallic salts such as copper formate, acetate, acrylate, thiocyanate, and iodide. Other examples are non-metallic salts such as ammonium formate and ammonium acrylate.

The various components of the solution may be deposited on the substrate concurrently or sequentially, or in some combination of the two. Thus, it is contemplated that the salt may be deposited concurrently with the ligand, or separately from the ligand. It is also contemplated that the solvent may itself comprise or contribute one or more aspects of the salt or the ligand.

As used herein the term "ligand" (L) refers to any substance which can be thermally activated to displace one or more aspects of the salt in a redox reaction, such that AB+LAL+B, or AB+LA+BL. In processes contemplated herein preferred ligands are non-crystalline, leave no non-metallic residue, and are stable under normal ambient conditions. More preferred ligands are also capable of taking part in redox reactions with a particular salt being used at reasonable temperatures, which are generally considered to be less than about 300° C.

A preferred class of ligands are nitrogen donors, including, for example, cyclohexylamine. A number of other nitrogen donors and their mixtures, however, may also be used. Examples are 3-picoline, lutidines, quinoline and isoquinoline, cyclopentylamine, cyclohexylamine, cycloheptylamine, cyclooctyl amine, and so forth. These are only a few examples, however, and many other aliphatic primary, secondary and tertiary amines and/or aromatic nitrogen donors may also be used.

Contemplated solutions may include other compounds besides salts and ligands. For example, a mixture of copper (II) formate in a nitrogen donor solvent with or without water and an alcohol may be used to facilitate transport from tip to substrate. A small amount of a solvent based polymer or a surfactant may also be useful additives for adjusting the rheology of the precursor solution to facilitate transport from tip to substrate, and to impart better film forming properties. On the other hand, larger amounts of high boiling solvents and/or additives such as triethylphosphate, Triton X100, glycerol, etc., are preferably to be avoided as these have a tendency to contaminate the film produced on account of incomplete pyrolysis over temperature sensitive substrates such as Kapton.TM. or paper. Still further, it may be worthwhile to treat the substrate with a coupling agent to improve the adhesion of the deposited material to the substrate as a function of the coupling agent's modifying the hydrophobicity or hydrophilicity of the surface of the substrate.

Where the salt contains a metal, all metals are contemplated. Preferred metals include conductive elements such as copper, silver and gold, but also include semiconductors such as silicon and germanium. For some purposes, especially production of catalysts, it is contemplated that metals such as cadmium, chromium, cobalt, iron, lead, manganese, nickel, platinum, palladium, rhodium, silver, tin, titanium, zinc, etc. can be used. As used herein, the term "metal" also includes alloys, metal/metal composites, metal ceramic composites, metal polymer composites, as well as other metal composites.

The substrate can comprise virtually any substance upon which a compound can be deposited. For example, contemplated substrates include metals and non-metals, conductors and non-conductors, flexible and inflexible materials, absorbent and non-absorbent materials, flat and curved materials, textured and non-textured materials, solid and hollow materials, and both large and small objects. Particularly preferred substrates are circuit boards, paper, glass, and metal objects. Viewed from another perspective, the wide breadth of contemplated substrates gives some indication of the scope of contemplated objects to which the present teachings may advantageously be applied. Thus, methods and apparatus taught herein may be used for a variety of applications, including multichip modules, PCMCIA cards, printed circuit boards, silicon wafers, security printing, decorative printing, catalysts, electrostatic shielding, hydrogen transport membranes, functionally gradient materials, production of nanomaterials, battery electrodes, fuel cell electrodes, actuators, electrical contacts, capacitors, and so forth. The methods and apparatus can be used as sensors and biosensors. The method and apparatus can be used to prepare templates for further lithography such as imprint nanolithography. Using the methods to connect nanowires and nanotubes is of particular interest.

Accordingly, the substrate is contemplated to represent any suitable substrate, including especially a circuit board, which may or may not be installed in or form part of an electronic device such as a computer, disk drive or other data processing or storage device, a telephone or other communication device, and a battery, capacitor, charger, controller or other energy storage related device.

Suitable energy sources contemplated herein include any source which is capable of effecting the desired chemical reaction(s) without causing excessive damage to the substrate or the coating. Thus, particularly preferred energy sources are radiative and convection heat sources, including especially infrared lamps and hot air blowers. Other suitable energy sources include electron beams, and radiative devices at non-IR wavelengths including x-ray, gamma ray and ultra-violet. Still other suitable energy sources include vibrational sources such as microwave transmitters. It should also be appreciated that the various energy sources can be applied in numerous ways. In preferred embodiments the energy source is directed at the precursor/ligand deposited on the substrate. However, in alternative embodiments, for example, a heated ligand could be applied to a cold precursor, or a heated precursor could be applied to a cold ligand.

Many advantages can be discerned from this invention including, for example, smooth surfaces, good coating adhesion, and control of coating thickness. Still another advantage of various embodiments of the present teachings is that coatings can be deposited with a purity of at least 80% by weight. In more preferred embodiments the purity of the metal or other material intended to be included in the coating is at least 90%, in still more preferred embodiments the purity is at least 95%, and in most preferred embodiments the purity is at least 97%.

Still another advantage of various embodiments of the present teachings is that coatings can be deposited with very little waste. In preferred embodiments at least 80% by weight of the material to be deposited on the substrate remains to form the desired pattern. For example, if copper (II) formate is used to produce a copper circuit, then at least 80% of the copper deposited on the substrate can remain to form the desired pattern, and no more than 20% of the copper is removed as "waste". In more preferred embodiments the waste is no more than 10%, in still more preferred embodiments the waste is no more than 95%, and in most preferred embodiments the waste is no more than 3%.

Still another advantage of various embodiments of the present teachings is low temperature operation. Metals, for example, can be deposited in desired patterns at temperatures of less than about 150° C., preferably less than about 100° C., more preferably less than about 75° C., and most preferably at ordinary room temperatures of room temperature (25–30° C.). The redox or "curing" step can also be performed at relatively low temperatures below about 100° C., more preferably below about 75° C., and even as low as about 50° C. Even lower temperatures are also possible, although below about 50° C. the redox reaction tends to be too slow for most applications. These ranges allow precursor solutions to be prepared at room temperature, the deposition to be performed at room temperature, and the decomposition to be accomplished using relatively low heat, as from a heat gun, in a room temperature environment.

The prior art describes additional methods and compositions which can be used to practice the present invention. For example, U.S. Pat. No. 5,894,038 to Sharma et al. (Apr. 13, 1999) is incorporated herein by reference in its entirety and discloses direct deposition of palladium including a process for forming a layer of palladium on a substrate comprising (1) preparing a solution of a palladium precursor, (2) applying the palladium precursor to the surface of the substrate, and (3) decomposing the palladium precursor by subjecting the precursor to heat. This method can also be adapted to carry out nanolithography according to the present invention.

In addition, U.S. Pat. No. 5,846,615 to Sharma et al. (Dec. 8, 1998) is incorporated herein by reference in its entirety and discloses decomposition of gold precursor to form a layer of gold on a substrate. This method can also be adapted to carry out nanolithography according to the present invention.

U.S. Pat. No. 4,933,204, moreover, is incorporated herein by reference in its entirety and discloses decomposition of a gold precursor to form gold features. This method can also be adapted to carry out nanolithography according to the present invention.

Still further, U.S. Pat. No. 6,548,122 to Sharma et al. (Apr. 15, 2003) is also incorporated herein by reference in its entirety and discloses use of copper (II) formate precursors, as well as gold and silver precursors.

Although the present invention is believed to be wide in scope, the following inks or patterning compounds are of particular interest for the present invention: copper formate or copper acetate; silver sulfate; silver nitrate; silver tetrafluroborate; palladium chloride, acetate, and acetylacetonate; hexachloroplatinic(IV) acid; ammonium iron citrate; carboxylates, (pseudo-)halides, sulfates, and nitrates of zinc, nickel, cadmium, titanium, cobalt, lead, iron, and tin; metalcarbonyl complexes, including chromium hexacarbonyl; amine bases, including cyclohexylamine, 3-picoline, (iso)

quinoline, cyclopentylamine, dimethylsulfoxide, dimethylformamide, formamide, ethylene diamine; polymers, including poly(ethyleneoxide), poly(methylmethacrylate), poly(vinylcarbozol), and poly(acrylamide).

In a preferred embodiment, for example, deposition can be carried out with use of aqueous solutions as ink, wherein the solutions comprise water, metal salt, and a water-soluble polymer such as a polyalkylene oxide polymer having molecular weight of about 50,000 or less. Aqueous solutions can be also useful as carriers for the reducing agent. For example, deposition of disodium palladium chloride in water with 10% polyethylene oxide (MW 10,000) via DPN printing on amino-silanized glass can be carried out (Schott Glass company), and subsequent chemical reduction to palladium metal using a reducing agent such as, for example, 0.03 M aqueous solution of dimethylamine:borane complex (DMAB). The concentration of the reducing agent can be varied to determine the best conditions for reduction. Atomic force micrographs of the patterns can be obtained before and after reduction. AFM imaging can be carried out with the tip which was used to deposit the structure or a different tip. If a different tip is used, the image can be better, particularly if the tip is selected or adapted for imaging rather than deposition. In general, polymers which are of commercial use in printing inks can be used in the present invention.

In another preferred embodiment, nanolithographic deposition can be carried out of palladium acetylacetonate (Pdacac) via DPN printing on an oxidized silicon substrate, and subsequent reduction by application of (1) a reducing agent, such as a liquid reducing agent like formamide, and (2) heat to the patterned surface. Another system is palladium acetate in DMF solvent. Before patterning and reduction, Pd(acac) can be dissolved in an organic solvent including a halogenated solvent such as chloroform to form an ink for use in coating a solid tip or passing through a hollow tip. Heat treatment can be sufficient to carry out the reduction including temperatures of, for example, about 100° C. to about 300° C. or about 150° C. The heat time, temperature, and atmospheric conditions can be adjusted to achieve the desired pattern. Generally, a heat time of one to five minutes at 150° C. can achieve a desired result. The stability of the deposited pattern can be examined by solvent rinsing, and the experimental conditions can be varied to improve the stability. Nanolithographic deposition experimental variables, including substrate and ink composition, also can be varied to provide better resolution. AFM micrographs can be obtained before reduction and after application of heat including use of height scan analysis of the patterns. The imaging parameters can be varied to improve image resolution.

In some cases, a tip such as a gold coated tip can catalyze reduction of a metal salt directly on the cantilever. The tip composition can be varied to prevent this. For example, an aluminum coated probe can be useful to avoid this reduction on the tip. Generally, the tips are preferably selected and adapted for long term use and avoid catalyzing reaction with the ink.

The reduction of a nanolithographically patterned metal salt can be also carried out by vapor reduction rather than liquid phase reduction, wherein the reducing agent is converted to vapor form and passed over the patterned substrate. Heaters known in the art can be used to heat the reducing agent to a vapor state as needed. In some cases, this type of treatment can improve the preservation of the original pattern during reduction.

In a preferred embodiment, deposition can be carried out for a silver salt emulsion consisting of ferric ammonium chloride, tartaric acid, silver nitrate, and water onto an aminosilanized glass substrate via DPN printing, followed by development by photoreduction under a UV lamp. AFM imaging can be carried out to show patterns.

In another preferred embodiment, the reduction step can be carried out with sufficient heat and sufficient time to reduce the metal salt without use of a chemically reducing agent. For example, temperatures below about 400° C. can be used, or below about 200° C. can be used. One skilled in the art can select temperatures and experiment accordingly based on a given ink system and pattern.

The deposition methods according to this invention also can include one or more pre-deposition steps, one or more probe cleaning or chemical modification steps aimed at improving ink coating; and one or more deposition steps, which may use dip pen nanolithography printing technology; one or more post-deposition steps, including cleaning steps and inspection steps.

Pre-deposition substrate surface treatment steps include but are not limited to (in no particular order):

(1) plasma, UV, or ozone cleaning, washing, drying, blow-drying,
(2) chemical cleaning, such as, for example, piranha cleaning, basic etching (eg. hydrogen peroxide and ammonium hydroxide);
(3) chemical or physical modification of the substrate to promote ink transport, or adhesion, or covalent modification (e.g., base treatment to impart a charged surface on silicon oxide, silanization with amino- or mercapto-silanizing agents, polymers carrying chemically reactive functional groups);
(4) protection against side-effects of following process steps (e.g. coating with a resist or thin film),
(5) inspection of the substrate with techniques derived from optical microscopy (e.g. AIMS), electron microscopy (e.g. CD SEM) or imaging (e.g. EDS, AES, XPS), ion imaging (e.g. TOF SSIMS) or scanning probe imaging (e.g. AFM, AC AFM, NSOM, EFM . . . ), any of the steps detailed below in the post-deposition section, and combination thereof.

Probe cleaning or modification steps include but are not limited to (in no particular order):

(a) plasma cleaning, washing, drying, blow-drying,
(b) chemical cleaning, such as piranha cleaning, basic etching (eg. hydrogen peroxide and ammonium hydroxide),
(c) chemical or physical modification of the probe to promote or enhance ink coating, adhesion, or transport (eg. base treatment to impart a charged surface of the silicon nitride tip, silanization with amino- or mercapto-silanizing agents, non-covalent modification with small molecule or polymeric agents such as poly(ethyleneglycol)) Such modifications include those that increase loading of the ink on the tip by increasing porosity or enhancing surface area available for ink delivery.

Deposition Steps:

Deposition steps include but are not limited to the deposition of one or more inks e.g. by DPN™ printing or deposition with one or more probe(s). Possible inks include but are not limited to precursors, compounds that will form the bulk of the final pattern, catalysts, solvents, small molecule or polymeric carrier agents, host matrix materials, or sacrificial reducing agents, and mixtures of above materials. They may be deposited as thin films or as thick multilayers (formed by multiple deposition steps), with or without variation of the chemical composition from layer to layer.

Post-deposition steps include but are not limited to (in no particular order):
(1) Heating of the substrate, for example with a heat lamp, hot air blower, or hot plate,
(2) Irradiation of the substrate with electromagnetic radiation (e.g., IR, visible, and UV light) or charged particles (e.g. electrons, ions drawn from a gun or a plasma source). This process may occur in air, vacuum, or in solution, with or without photosensitizing agents,
(3) Immersion of the patterned substrate in one or more solutions,
(4) Electrochemical reduction,
(5) Chemical reduction,
(6) Exposure of the patterned substrate to a vapor or gas,
(7) Sonication of the patterned substrate, as well as all nano-scale, local equivalents of the steps outlined above, if applicable, the source of the energy and/or composition of matter been provided by one or more probe(s), which may or may not be the same than the DPN probe(s); which include but is not limited to:
(a) Local heating of the deposited matter or surrounding substrate,
(b) Local irradiation of the deposited matter or surrounding substrate, and all combinations thereof.

The succession of all or some steps may be repeated several times.

The metallic nanostructures can be in the form of conductive nanoscopic grids which can include nanowires. For example, crossbar structures can be formed. Metallic layers can be formed on top of each other. Structures can be included to integrate the nanoscopic conductive patterns with microscopic and macroscopic testing methods. Resistors, capacitors, electrodes, and inductors can be used as desired to form a circuit. Semiconductors and transistors can be used as desired. Formation of multilayers can be carried out to increase the height of the structure. Different metals can be in different layers of the multilayer. The methods of the invention can be used to electrically connect electrodes. In sensor applications, for example, the metallic deposit can have a resistivity which is modified when an analyte of interest binds to the structure. In biosensor applications, for example, antibody-antigen, DNA hybridization, protein adsorption, and other molecular recognition events can be used to trigger a change in resistivity. The methods of this invention can be also used for bar code applications.

U.S. Pat. No. 6,579,742 to Chen, for example, describes nanolithographic structures formed by imprinting for nanocomputing and microelectronics applications. Imprinting, however, can suffer from mold stickiness effects. U.S. Pat. No. 6,579,742 nanocomputing applications and structures can be carried out using the nanolithographic methods described herein, and this patent is incorporated by reference in its entirety.

The substrate can be a protosubstrate as described in, for example, U.S. regular patent application Ser. No. 10/444, 061 filed May 23, 2003 to Cruchon-Dupeyrat et al "Protosubstrates". This allows electrical conductivity of the printed structure to be examined by macroscopic methods.

Non-limiting working examples are described below.

WORKING EXAMPLES

General Approach:

This methods provide for direct deposition of metal nanopatterns. Oxidizing and reducing compounds can be mixed together, applied to the tip, and deposited on the substrate at selected locations by DPN™ printing or deposition. The ink mixture can be then heated (either by heating of the whole substrate or by local probe-induced heating). Specifically, a metal salt and organic ligand cocktail can be used. A typical ink formulation can comprise a metal salt (e.g. carboxylate, nitrate, or halide) along with an appropriate organic Lewis base or ligand (amines, phosphines). Additives (small molecules such as ethyleneglycol, polymers such as polyethyleneoxide, PMMA, polyvinylcarbazol, etc) may also be used that modify the solubility, reactivity, or rheological properties of the ink. After deposition of the ink mixture, gentle heating in an ambient or inert environment (e.g., 40–200° C.) can assist the dis-proportionation of the salt to form a metallic precipitate and a volatile organic. This approach enables deposition of a variety of metals or metal oxides including, for example copper, under mild conditions with very little organic contaminant [see, for example, Sharma et al., U.S. Pat. No. 5,980,998, the complete disclosure of which is hereby incorporated by reference, in particular for the materials deposited]. Potential pitfalls may occur if the ligand evaporates from the patterned substrate before reaction takes place. In that case, the salt-patterned substrate may be exposed to a ligand in a second step prior to the heating.

Deposition experiments and AFM imaging can be carried out with a CP Research AFM (Veeco) or an Nscriptor (NanoInk). For both deposition and imaging, contact mode can be used including topography or lateral force modes.

Example 1

One specific example of the use of this method used DPN™ printing or deposition to pattern palladium acetylacetonate dissolved in chloroform (1 mg/microliter; generally, almost saturated solutions of inks are desired) on oxidized silicon, glass, or amino-silanized glass. After patterning of the dots, a droplet (1 microlitre) of formamide was placed on the horizontal substrate and heated to 150° C. for 2 min. The resulting metal patterns were stable towards solvent rinsing (including water, alcohols, and other non-polar organics) while the salt patterns prior to reduction were removed by solvent rinsing. FIG. 1 shows AFM images and a height scan of the patterns before (FIG. 1a) and after treatment (FIGS. 1b and 1c) with formamide and heat.

Example 2

Palladium nanopatterns were deposited by DPN printing and metallized by vapor reduction. A DPN ink consisting of palladium acetate in dimethylformamide was patterned onto silicon oxide using the DPN technique. The DPN pen used was a silicon nitride probe with a gold coating. This process also works well with aluminum coated DPN probes because the Al coating does not catalyze the reduction of the metal salt directly onto the cantilever as does the gold coated probes. Prior to patterning the silicon/silicon oxide wafer was cleaned by sonication in millipore water for 5 minutes. The patterned substrate was placed vertically in a conical polyethylene tube and 10 microlitres of formamide liquid was placed in the bottom of the tube. The tube was placed on a heating block and heated at 80° C. for 30 min. so that the vapor caused reduction of the metal precursor. This method is useful because it preserves the metal pattern on the substrate. The resulting metal structures are resistive to solvent rinsing and other common methods of cleaning.

Example 3

Figure 2:
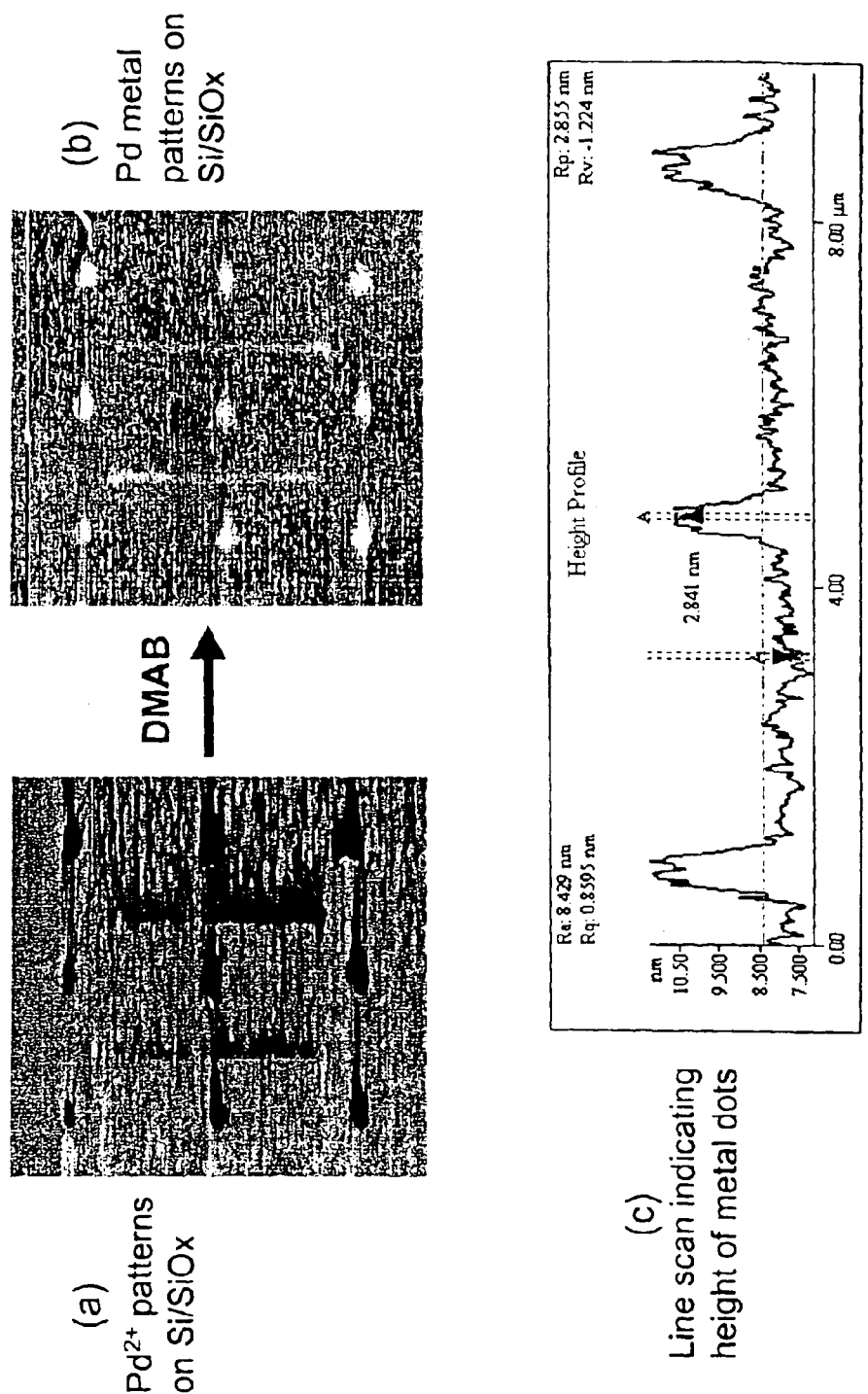
FIG. 2 illustrates AFM data of palladium structures according to the present invention in Working Example 3.

Palladium nanopatterns deposited by DPN metallized by chemical reduction. A DPN ink consisting of disodium palladium chloride in water with 10% polyethyleneoxide (MW 10,000) was patterned onto amino-silanized glass (Schott Glass company) using the DPN technique. The patterned substrate was exposed to a solution of 0.03M aqueous solution of dimethylamine:borane complex (DMAB) to cause reduction of the metal precursor to conducting metal. The resulting metal structures are resistive to solvent rinsing. FIG. 2 shows AFM images and a height scan of the patterns before (2a) and after (2b, 2c) treatment with DMAB.

Example 4

Figure 3:
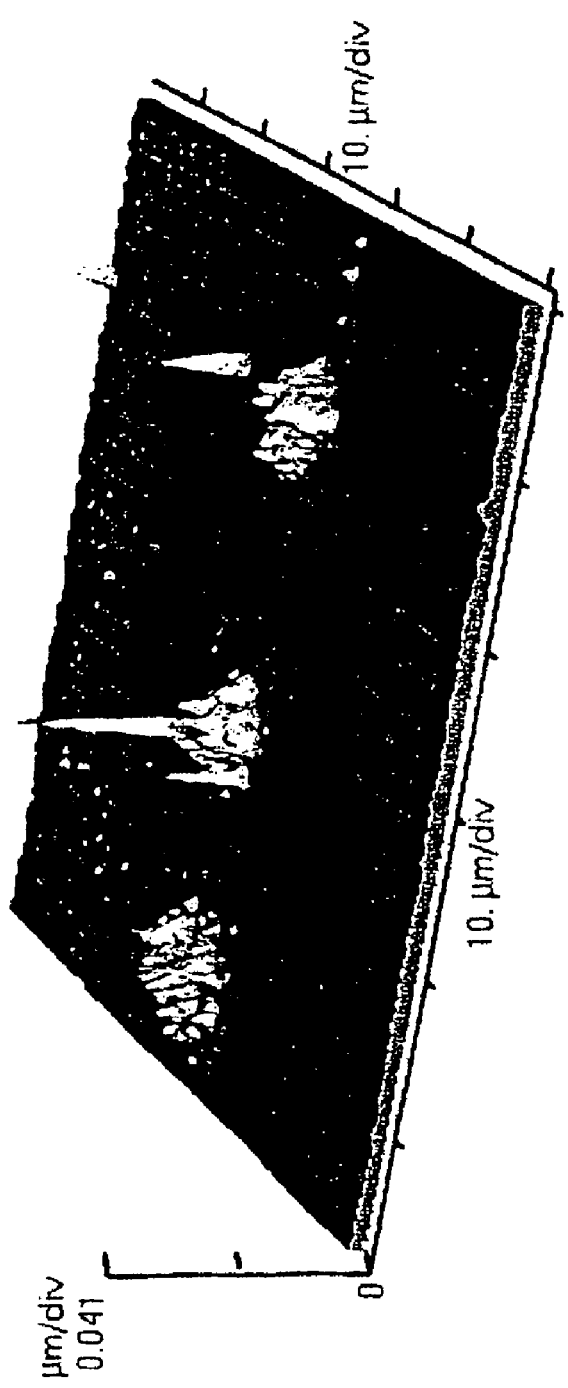
FIG. 3 illustrates AFM data of platinum structures according to the present invention in Working Example 4.

Platinum nanopatterns deposited by DPN metallized by chemical reduction. A DPN ink consisting of platinum tetrachloride in water was patterned onto amino-silanized glass (Schott Glass company) using the DPN technique. The patterned substrate was exposed to a solution of 0.03M aqueous solution of dimethylamine:borane complex (DMAB) to cause reduction of the metal precursor to conducting metal. The reduction reaction occurs within seconds of immersion. The resulting metal structures are resistive to solvent rinsing. FIG. 3 shows an AFM height scan of platinum nanostructures deposited by DPN and reduced by DMAB.

Example 5

Figure 4:
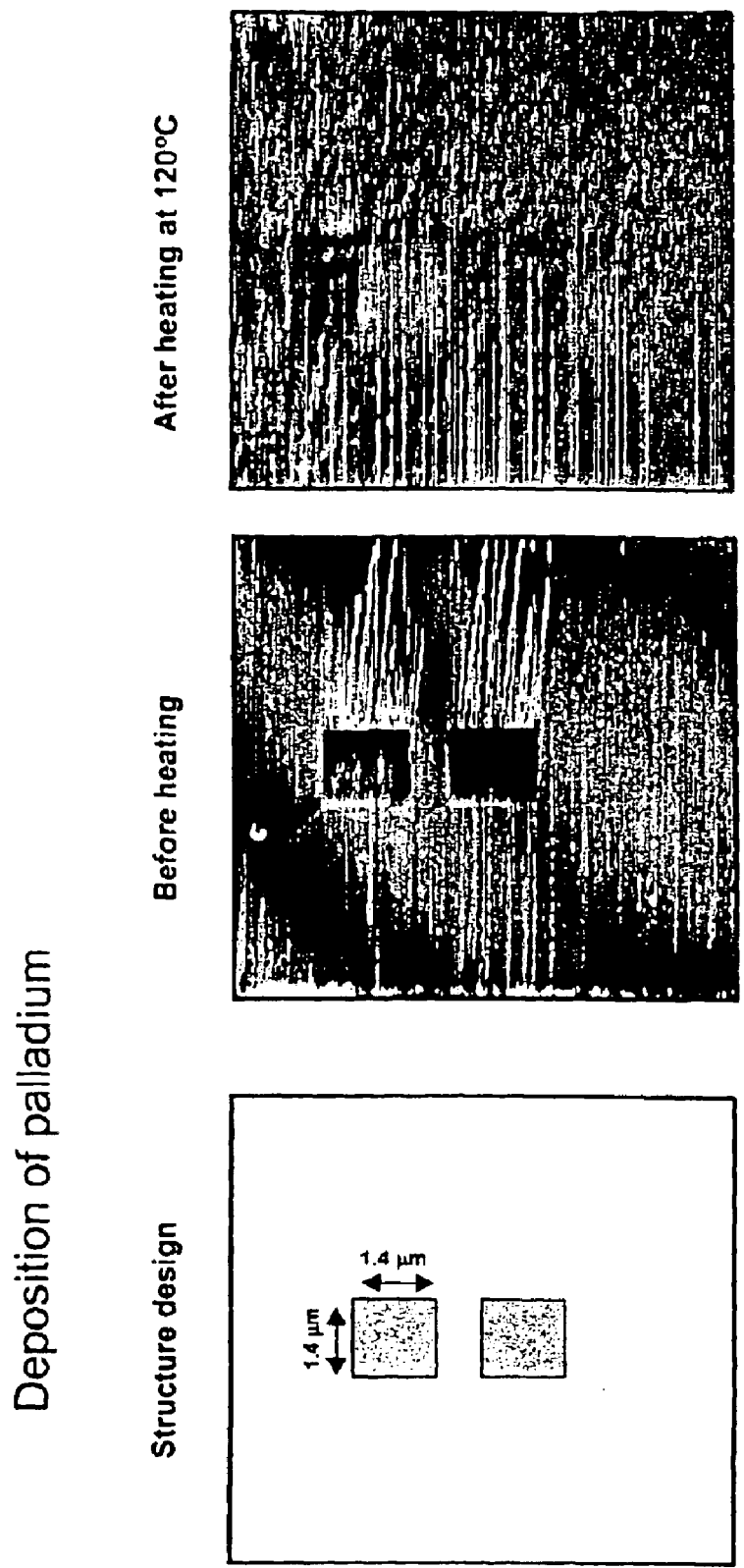
FIG. 4 illustrates AFM data of palladium structures according to the present invention in Working Example 5.
Figure 5:
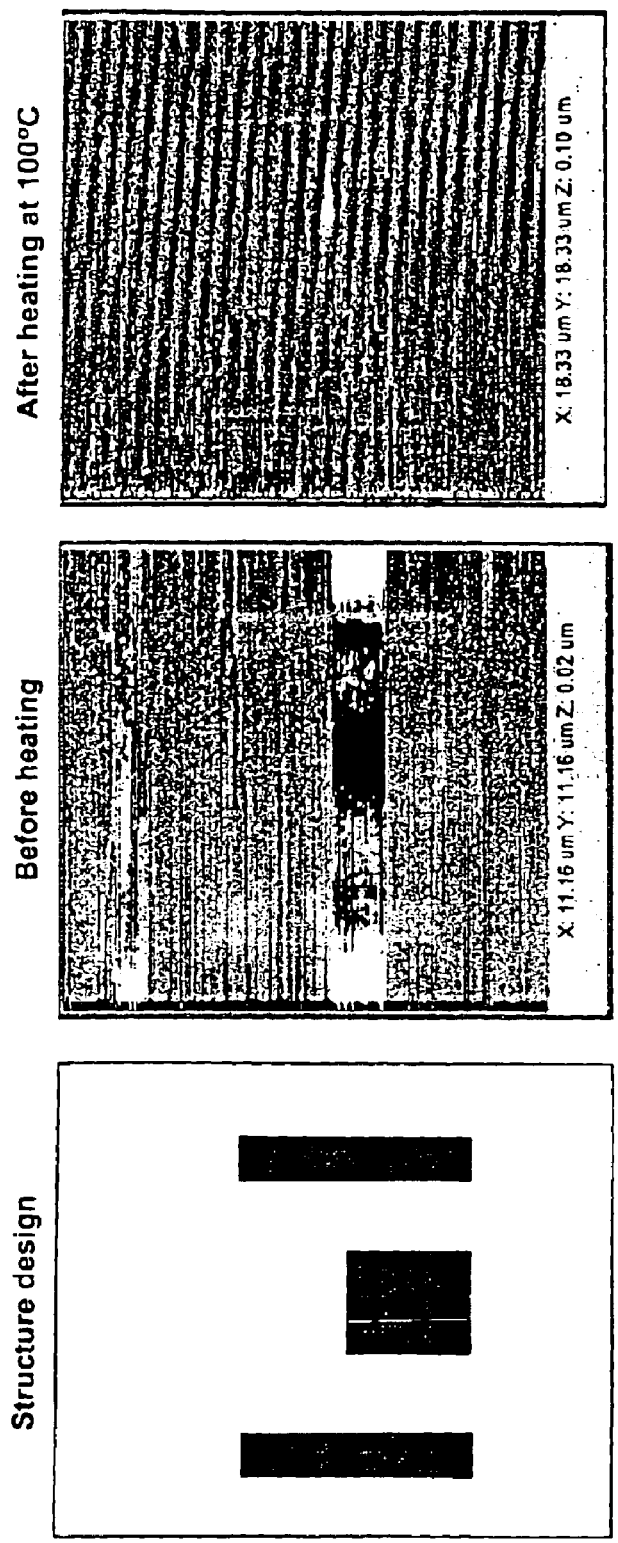
FIG. 5 illustrates AFM data of palladium structures according to the present invention in Working Example 5.

Palladium patterns deposited by DPN. A DPN ink consisting of palladium acetate in dimethylformamide was patterned onto silicon oxide using the DPN technique. Prior to patterning the substrate was cleaning in piranha solution for 15 min at 80° C. After patterning the substrate was heated using a hot plate in air for at least 1 minute. After heating the pattern was imaged by AFM. The resulting metal structures show high topography and are resistive to solvent rinsing and other common methods of cleaning. FIG. 4 and FIG. 5 shows a desired structure design (left figure) and actual patterns before reduction (center figures) and after thermal reduction (right figures). The imaging of these patterns, particularly those patterns already reduced, can be improved by, for example, using clean tips not used for deposition.

What is claimed is:

1. A method of depositing a conductive coating in a desired pattern onto a substrate comprising:
    depositing a precursor onto the substrate in the desired pattern by nanolithography with use of a tip coated with the precursor,
    contacting the precursor with a ligand,
    applying sufficient energy to transfer electrons from the ligand to the precursor, thereby decomposing the precursor to form a conductive precipitate in the desired pattern and thus forming the conductive pattern directly on the substrate.

2. The method according to claim 1, wherein the tip is a nanoscopic tip.

3. The method according to claim 1, wherein the tip is a scanning probe microscopic tip.

4. The method according to claim 1, wherein the tip is an atomic force microscope tip.

5. The method of claim 1, wherein the coating comprises a metal with a purity of at least about 80%.

6. The method of claim 1, wherein the coating comprises a metal with a thickness of less than about 10 angstroms.

7. The method of claim 1, wherein the coating comprises a metal with a thickness of at least about 100 angstroms.

8. The method of claim 1, wherein the precursor comprises a salt selected from the group consisting of a carboxylate, a halide, a pseudohalide, and a nitrate.

9. The method of claim 1, wherein the precursor comprises a carboxylate.

10. The method of claim 1, wherein the pattern comprises a circuit.

11. The method of claim 1, wherein the ligand comprises a material selected from the group consisting of an amine, an amide, a phosphine, a sulfide, and an ester.

12. The method of claim 1 wherein the ligand is selected from the group consisting of a nitrogen donor, a sulphur donor, and a phosphorous donor.

13. The method of claim 1 wherein the precipitate comprises a metal.

14. The method of claim 1 wherein the precipitate is selected from the group consisting of copper, zinc, palladium, platinum, silver, gold, cadmium, titanium, cobalt, lead, tin, silicon and germanium.

15. The method of claim 1 wherein the precipitate comprises an electrical conductor.

16. The method of claim 1 wherein the precipitate comprises an electrical semiconductor.

17. The method of claim 1 wherein the substrate comprises a non-conductor.

18. The method of claim 1 wherein the substrate comprises at least one of a conductor and a semiconductor.

19. The method of claim 1 wherein the step of applying energy comprises applying heat.

20. The method of claim 19, wherein the precipitate is selected from the group consisting of copper, zinc, palladium, platinum, silver, gold, cadmium, titanium, cobalt, lead, tin, silicon and germanium.

21. The method of claim 19, wherein the step of applying energy comprises applying radiant heat.

22. The method of claim 1 wherein the step of applying energy comprises applying infra red radiation or UV radiation.

23. The method of claim 1 wherein the step of applying energy comprises applying vibrational energy.

24. The method of claim 1 wherein the precursor comprises a salt selected from the group consisting of a carboxylate, a halide, a pseudo halide, a nitrate, and the ligand comprises a material selected from the group consisting of an amine, an amide, a phosphine, a sulfide and an ester.

25. A method of printing a conductive metal in a desired pattern onto a substrate comprising:
    drawing a metal precursor and ligand directly onto the substrate according to the desired pattern using nanolithography with use of a tip coated with a precursor; and
    decomposing the precursor by applying energy to form the conductive metal in the desired pattern, without removing from the substrate a substantial quantity of the precursor, and without removing from the substrate a substantial quantity of the metal.

26. The method of claim 25, wherein the metal pattern comprises a substantially pure metal, with impurities less than about 20% by weight.

27. The method of claim 25, wherein the step of decomposing comprises thermally decomposing.

28. The method of claim 25 wherein the step of decomposing comprises thermally decomposing at a temperature of less than about 300° C.

29. The method of claim 25, wherein the metal is selected from the group consisting of an elemental metal, an alloy, a metal/metal composite, a metal ceramic composite, and a metal polymer composite.

30. A nanolithographic method comprising:

depositing a metallic precursor from a tip onto a substrate to form a nanostructure, and subsequently converting the precursor nanostructure to a metallic deposit.

31. The method according to claim 30, wherein the deposition and conversion is carried out without use of an electrical bias between the tip and substrate.

32. The method according to claim 30, wherein the deposition and conversion is carried out with use of a chemical agent other than the substrate.

33. The method according to claim 30, wherein the tip is a nanoscopic tip.

34. The method according to claim 30, wherein the tip is a scanning probe microscopic tip.

35. The method according to claim 30, wherein the tip is an AFM tip.

36. The method according to claim 35, wherein the deposition and conversion is carried out without use of an electrical bias between the tip and substrate.

37. The method according to claim 30, wherein the method is repeated to form a multilayer.

38. The method according to claim 30, wherein the tip is adapted to not react with the precursor.

39. The method according to claim 30, wherein the method is used to connect at least one nanowire with another structure.

40. The method according to claim 30, wherein the method is used to connect at least two electrodes.

41. The method according to claim 30, wherein the method is used to prepare a sensor.

42. The method according to claim 30, wherein the method is used to fabricate a lithographic template.

43. The method according to claim 30, wherein the method is used to prepare a biosensor.

44. A nanolithographic method consisting essentially of:

depositing an ink composition consisting essentially of a metallic precursor from a nanoscopic tip onto a substrate to form a nanostructure, and subsequently converting the metallic precursor of the nanostructure to a metallic form.

45. The method according to claim 44, wherein the conversion is a thermal conversion without use of a chemical agent.

46. The method according to claim 44, wherein the conversion is a chemical conversion carried out with use of a reducing agent.

47. The method according to claim 44, wherein the reducing agent is used in the vapor state to carry out the conversion.

48. The method according to claim 44, wherein the tip is an AFM tip.

49. The method according to claim 44, wherein the tip comprises a surface which does not react with the precursor.

50. A method according to claim 44, wherein the method is repeated a plurality of times to generate a multi-layer structure.

51. A method of printing without use of electrochemical bias or reaction between the ink and substrate comprising depositing a metallic precursor ink composition onto a substrate from a tip in the form of a microstructure or nanostructure on the substrate to form an array having discreet objects separated from each other by about one micron or less.

52. The method according to claim 51, further comprising the step of forming metal from the precursor.

53. The method according to claim 51, wherein the discreet objects are separated from each other by about 500 nm or less.

54. The method according to claim 51, wherein the discreet objects are separated from each other by about 100 nm or less.

* * * * *